United States Patent [19]

Miura et al.

[11] Patent Number: 5,168,030
[45] Date of Patent: Dec. 1, 1992

[54] POSITIVE TYPE O-QUINONE DIAZIDE PHOTO-RESIST CONTAINING ANTISTATIC AGENT SELECTED FROM HYDRAZONES, ETHYLCARBAZOLE AND BIS(DIMETHYLAMINO)BENZENE

[75] Inventors: Konoe Miura, Yokohama; Tameichi Ochiai, Sagamihara; Yasuhiro Kameyama, Machida; Tooru Koyama, Itami; Takashi Okabe, Itami; Tomoharu Mametani, Itami, all of Japan

[73] Assignees: Mitsubishi Denki Kabushiki Kaisha; Mitsubishi Kasei Corporation, both of Tokyo, Japan

[21] Appl. No.: 742,513

[22] Filed: Aug. 5, 1991

Related U.S. Application Data

[60] Continuation of Ser. No. 489,974, Mar. 7, 1990, abandoned, which is a division of Ser. No. 408,956, Sep. 18, 1989, Pat. No. 4,933,257, which is a continuation of Ser. No. 106,253, Oct. 9, 1987, abandoned.

[51] Int. Cl.$^5$ .................. G03F 7/022; G03C 1/61
[52] U.S. Cl. ..................... 430/191; 430/165; 430/192; 430/193
[58] Field of Search ............... 430/191, 192, 165, 193

[56] References Cited

U.S. PATENT DOCUMENTS

| | | | |
|---|---|---|---|
| 4,142,892 | 3/1979 | Paul | 430/191 |
| 4,296,194 | 10/1981 | Harper et al. | 430/191 |
| 4,431,725 | 2/1984 | Tachikawa et al. | 430/191 |
| 4,575,480 | 3/1980 | Kotani et al. | 430/192 |
| 4,701,399 | 10/1987 | Nagano et al. | 430/191 |
| 4,828,960 | 5/1989 | Hertog | 430/191 |

FOREIGN PATENT DOCUMENTS

| | | |
|---|---|---|
| 182587 | 5/1986 | European Pat. Off. ............ 430/191 |
| 47-030214 | 8/1972 | Japan . |
| 59-107347 | 6/1984 | Japan . |
| 62-113136 | 5/1987 | Japan . |
| 62-113139 | 5/1987 | Japan . |
| 62-199611 | 9/1987 | Japan . |

OTHER PUBLICATIONS

Japanese Patent Application No. 242793/86 Summarized Translation of Notice of Rejection (Official Action Dated Apr. 14, 1992).

Primary Examiner—Charles L. Bowers, Jr.
Assistant Examiner—Christopher G. Young
Attorney, Agent, or Firm—Oblon, Spivak, McClelland, Maier & Neustadt

[57] ABSTRACT

Disclosed herein is an antistatic photo-resist containing an antistatic agent. Since antistatic photo-resist according to the present invention is hardly charged, it can be suitably used as a mask in implanting ions into semiconductor substrate.

5 Claims, 1 Drawing Sheet

POSITIVE TYPE O-QUINONE DIAZIDE PHOTO-RESIST CONTAINING ANTISTATIC AGENT SELECTED FROM HYDRAZONES, ETHYLCARBAZOLE AND BIS(DIMETHYLAMINO)BENZENE

This application is a continuation of application Ser. No. 07/489,974, filed on Mar. 7, 1990, now abandoned, which is a division of application Ser. No. 07/408,956, filed on Sep. 18, 1989, U.S. Pat. No. 4,933,257 which is a continuation of Ser. No. 07/106,253 filed on Oct. 9, 1987 abandoned.

BACKGROUND OF THE INVENTION

The present invention relates to a photo-resist composition, and more in detail, the present invention relates to an antistatic photo-resist suitable for use as a mask in ion implantation to the semiconductor substrate.

The introduction of an impurity is indispensable in the process of producing a semiconductor. Hitherto, a method of thermal dispersion has been mainly employed in the introduction of the impurity, however, in recent years, the so-called ion implantation method wherein the ions of substance to be introduced are electrostatically accelerated and implanted into a solid body has come to be mainly employed, because the control of the method is easy. Since the impurity can be doped at a low temperature by this method, it has become possible to use the photo-resist as the mask in doping. However, there has been the following demerit in using the photo-resist as the mask in doping. Namely, in the case where ions are implanted part by to the substrate, the ion implantation is carried out after forming the pattern of the photo-resist on the part to which the ions are not to be implanted for the purpose of masking. However, the photo-resist is ordinary comprising a high polymeric substance and is non-electroconductive. Accordingly, the surface of the photo-resist is electrically charged during the ion implantation. The amount of electrical charge increases with the increase of electrical current for ion implantation, and the resulting charge becomes to cause dielectric breakdown of the insulating membrance such as silicon oxide membrane under the photo-resist. FIG. 1 of the attached drawing shows the process of causing dielectric breakdown in the ion implantation. FIG. 1(a) is the figure wherein an oxide membrane(2) is grown on a silicon substrate (1) and a photo-resist(3) is patterned further on the oxide membrane(2). FIG. 1(b) shows the manner of implantation of the ions(4).

Since the ions to be implanted are positively charged, the surface of the photo-resist is positively charged(5). FIG. 1(c) shows that the amount of electrical charge on the surface of the photo-resist increases and dielectric breakdown in the silicon oxide membrane is caused.

The electrical charge on the surface of the photo-resist at the time of ion implantation have an undesirable effect on the uniformity of the ion implantation to the substrate to be processed even though the electrical charge does not cause the dielectric breakdown of the insulating membrane under the patterned photo-resist. Namely, according to the electrical field caused by the electrical charge on the surface of the photo-resist, the ion beam is bended and accordingly, the amount of the implanted ions is the minimum at the central part of the substrate to be processed and becomes larger toward the peripheral parts of the substrate.

As is shown above, in the conventional ion implantation method, the surface of the patterned photo-resist is electrically charged, and as a result, there have been the problems such as the occurrence of dielectric breakdown in the insulating membrane under the patterned photo-resist and/or the inequality of the amount of implanted ions to the substrate to be processed.

Since the above-mentioned problems become remarkable with the increase of the amount of electric current for implanting the ions, the amount of electrical current for implanting the ions should be irresistively withhold low up to now, and the reduction of the time for the ion implantation could not be attained. Besides, with the miniaturization of electric elements, the thickness of the insulating membrane such as the silicon oxide membrane, etc. becomes thinner, and accordingly, the breakdown voltage becomes lower. In such a situation, the dielectric breakdown in the insulating membrane at the time of the ion implantation has come to be an important problem furthermore.

At present, as a method of reducing the electric charge on the surface of the photo-resist pattern at the time of implanting the ions, a method wherein electrons are supplied to the vicinity of the surface of the substrate to be processed for neutralizing the electrical charge. However, in this method, it is difficult to supply the optimum amount of the electrons and there has been the problems that it is necessary to add an extra apparatus for supplying electrons to the ion implantation apparatus.

As a result of the present inventors' studies concerning the above problems, it has been found out by the present inventors that the above problems can be overcome by using the photo-resist containing an antistatic agent, and on the basis of the finding, the present invention have been acomplished.

SUMMARY OF THE INVENTION

In an aspect of the present invention, there is provided an antistatic photo-resist used for a mask in ion implantation to a semiconductor substrate, which comprises an antistatically effective amount of an antistatic agent and a photo-resist.

BRIEF DESCRIPTION OF THE DRAWING

Of the attached drawing.

DETAILED DESCRIPTION OF THE INVENTION

Figure 1A:
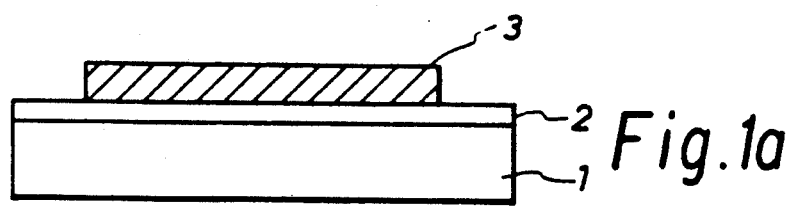
FIG. 1 shows the process the occurrence cf the dielectric breakdown In FIG. 1, 1 indicates a silicon substrate, 2 indicates an oxide membrane, 3 indicates a photo-resist and 4 indicates ion beam.
Figure 1B:
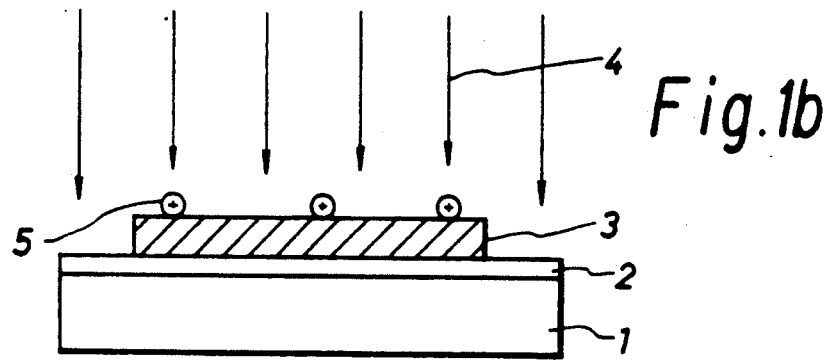
Figure 1C:
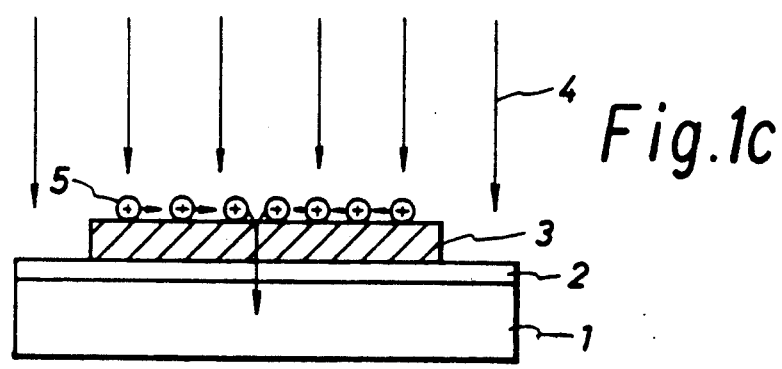

Hitherto, the surface resistance of a photo-resist used at the time of ion implantation is over about $10^{14}$ Ω and this high insulating property is the main reason for dielectric breakdown of the insulating membrane. The present inventors have found that by adding an antistatic agent to the photo-resist, the surface resistance is reduced and the dielectric breakdown, etc can be prevented.

It is preferable that the antistatic agent used in the present invention fulfills the following properties.

(1) The antistatic agent has a compatibility to the photo-resist composition or can be uniformly dispersed therein.

(2) The antistatic agent does not contain ions and elements which give undesirable influences to the performance of the electric element produced. More precisely, the antistatic agent does not contain any alkali metal ion, halogen ion and heavy metal.

(3) The antistatic agent does not reduce the sensitivity of the photo-resist to light so much. More precisely, the antistatic agent does not absorb so much the light of the wavelength at which the photo-resist absorbs the light.

(4) The antistatic agent does not reduce the resolving power of the photo-resist.

As the example of the antistatic agent showing the above properties, organic conductive substances of chargetransfer complex type, substances having a low ionization potential preferably not greater than 7.5 eV, more preferably not greater than 7.0 eV, to make the hopping conduction of hole possible may be mentioned.

As the example of the former substances, there is a complex prepared by combining tetrathiafurvalene (TTF) as a donor with tetracyanoquinodimethane(TCNQ) as an accepter, so-called the TTF-TCNQ complex. Furthermore, as the example of the donor, condensed-polynuclear aromatic compounds such as chrysene, pyrene, etc.; aromatic amines such as p-diaminobenzene, 4,4'-bis(dimethylamino)bephenyl, naphthylamine, etc. and heterocyclic compounds such as dibenzopyrazine, etc. may be mentioned. As the example of the acceptor, polycyano compounds such as tetracyanoethane, etc.; quinone derivatives such as chloranil, bromanil, fluoranil, dicyanodichloroquinone, etc. and polynitro compounds such as trinitrobenzene, etc. may be mentioned. A charge-transfer complex prepared by combining one of such donors with one of such acceptors is used for the purpose of the present invention. Of the above charge-transfer complexes, the TTF-TCNQ is preferred.

As the example of the substance having a low ionization potential, heterocyclic compounds such as ethylcarbazole, derivatives of pyrazoline, derivatives of oxadiazole, etc.; derivatives of hydrazone such as p-dimethylaminobenzaldehyde diphenylhydrazone, etc. and aromatic amines such as p-bis(dimethylamino)benzene, etc. may be mentioned. Of the above substances, the derivative of hydrazone and the aromatic amines are preferred.

Also, conductors or semiconductors containing element such as boron, phosphorous, etc. may be used as the antistatic agent.

Any amount of addition of the antistatic agent may be used so far as a sufficient antistatic effect is obtained and the original properties of the photo-resist are not deteriorated, however, the amount is preferably 0.1 to 15% by weight, more preferably from 0.5 to 10% by weight based on the solid content of the photo-resist.

As the photo-resist to which the antistatic agent is added, a positive-type photo-resist which is obtained by combining a photosensitizer of naphthoquinone diazides with a novolac resin formed by polycondensing a hydroxyaromatic compound such as phenol, cresol, ethylphenol, t-butylphenol, xylenol, naphthol, 1,4-dihydroxybenzene, 1,3-dihydroxybenzene, etc. or a mixture thereof with an aldehyde such as formaldehyde, acetaldehyde, benzaldehyde, furfural, etc.; polyhydroxystyrene or a derivative thereof and a negative-type photo-resist which is obtained by combining a photosensitizer of azides with a resin of cyclized rubber are used, and particularly, the positive-type photo-resist comprising novolac resin and a photosensitizer is preferred.

Although the photosensitizer of naphthoquinone diazides is not particularly limited, for instance, the compounds disclosed in J. Kosar, "Light-sensitive Systems", John Wiley & Sons, Inc, 343-351 may be mentioned. As the preferred ones, esters of 1,2-benzoquinonediazide-4-sulfonic acid, esters of 1,2-naphthoquinonediazide-5-sulfonic acid, esters of 1,2-naphthoquinoniiazide-4-sulfonic acid, etc. may be mentioned. More preferably, an ester of a polyhydroxy aromatic compound with 1,2-naphthoquinonediazide-5-sulfonic acid or 1,2-naphthoquinonediazide-4-sulfonic acid is used. As the polyhydroxy aromatic compound, 2,3,4-trihydroxybenzophenone, 2,3,4,4'-tetrahydroxybenzophenone, quercetin, etc. are preferably used.

The present inventors have formerly proposed several examples of the positive-type photo-resist comprising novolac resin and a photosensitizer [refer to Japanese Patent Applications No. 58-150035(1983), No. 58-158301(1983), No. 59-12792(1984), No. 59-30097(1984) and No. 60-25660(1985)].

The mixing amount of the photosensitizer of naphthoquinonediazides is preferably 5 to 100 parts by weight of the novolac resin. Usually, these components are used by dissolving in a suitable solvent. As the solvent, there is no limit so far as the solvent has a sufficient dissolving power to the photosensitizer and the novolac resin and gives a favorable coating property, however, cellosolves such as methylcellosolve, ethylcellosolve, methylcellosolve acetate, ethylcelosolve acetate, etc., esters such as butyl acetate, amyl acetate, etc., high polar solvents such as dimethylformamide, dimethylacetamide, N-methylpyrrclidone, etc., a mixture thereof and a mixed solvent prepared by adding an aromatic hydrocarbon thereto may be mentioned.

As the resin of cyclized rubber, those which are obtained by partially cyclizing poly(cis-isoprene) may be preferably used. As the photosensitizer of azide, for instance, the compounds disclosed in J. Koser, "Light-sensitive Systems", John Wiley & Sons, Inc., 330-336 may be mentioned. As the preferred ones, 2,6-di(4'-azidobenzal)-4-methylcyclohexanone may be mentioned. Usually, these components are used by dissolving in a suitable solvent. As the solvent, there is no limit so far as the solvent has a sufficient dissolving power to the photosensitizer and the resin and gives a favorable coating property, however, aromatic hydrocarbon such as xylene, toluene, methylbenzene, etc. may be preferably used.

The antistatic photo-resist according to the present invention is used as a mask in ion implantation in a manner, for example, as set forth below. The photo-resist according to the present invention is applied on a substrate to be implanted with ions into a thickness of 0.2 to 2.5 μm by spin-coating method, then, the applied photo-resist is patterned by exposure to light and development. The substrate having the patterned photo-resist thereon is subjected to ion implantation after exposing the part to be ion-implanted. After ion implantation, the remaining photo-resist on the substrate is removed by a photo-resist remover or by plasma incineration, thereby obtaining a substrate implanted with ions.

It has been known that in the case of carrying out an ion implantation to an insulating body with a large electric current, the uniformity of the implantation is deteriorated by the electrification of the insulating body. Ordinarily, in the case when the ion implantation is carried out using a photo-resist as the mask, since the photo-resist is an insulating body, the difference in the implantation amount between the vicinity of the center part and the peripheral parts of the wafer occurs, and accordingly, the percentage of good products is reduced.

However, by using the antistatic photo-resist according to the present invention, the electrification is prevented and any difference in the implantation amount does not occur, namely the uniformity of ion implantation ($\pi/x$) defined below is preferably not higher than 50%, more preferably not higher than 30%.

The present invention will be explained precisely while referring to the following non-limitative Examples.

EXAMPLE 1

Into 70.4 g of ethylcellosolve acetate, 22.2 g of a novolac resin obtained by polycondensing a mixture of m-cresol, p-cresol and 2,5-xylenol (in a molar ratio of 3:4:3) with formal-dehyde using oxalic acid as a catalyst and 7.4 g of 1,2-naphthoquinonediazide-5-sulfonic ester of 2,3,4,4'-tetrahydroxybenzophenone (esterification: 75%) were dissolved. Into the thus formed solution, 0.296 g of TTFTCNQ complex was dissolved, and the thus formed solution was filtered by a membrane filter (0.2μ in pore diameter, made by MILLIPORE Co.) to prepare an antistatic photo-resist.

The evaluation of the effectiveness of the thus prepared photo-resist was carried out by the following method.

After applying the photo-resist on a quartz wafer by the spin-coating method, prebaking the thus coated wafer for 1 min at 90° C., and then, patterning the photo-resist, ion implantation was carried out by a rotation disk-type ion implantation apparatus of a large electric current (made by NIHON SHINKU Co., Ltd.) under the conditions ($As^+$ $4\times10^{15}$ $cm^{-2}$, current value of 2 mA and accelerating energy of 50 eV). After carrying out the ion implantation, the uniformity of the ion implantation was evaluated by an ion-scanner (made by ION-SCAN Co., Ltd.). Still more, the value of surface resistance of the photo-resist was measured.

The results are shown in Table 1.

EXAMPLE 2

In the same manner as in Example 1 except for using p-diethylaminobenzaldehyde diphenylhydrazone (ionization potential: 6.55eV) instead of TTF-TCNQ complex of Example 1, an antistatic photo-resist was prepared and the evaluation of the thus prepared antistatic photo-resist was carried out in the same manner as in Example 1. The results are shown in Table 1.

EXAMPLE 3

In the same manner as in Example 1 except for using "HI-BORON SC" (an organic semiconductor, made by BORON INTERNATIONAL Co., Ltd.) instead of TTF-TCNQ complex of Example 1, an antistatic photo-resist was prepared and the evaluation of the thus prepared antistatic photo-resist was carried out in the same manner as in Example 1. The results are shown in Table 1.

COMPARATIVE EXAMPLE

The evaluation of AZ-1350 (a photo-resist of novolac resin, made by HOECHST) was carried out in the same manner as in Example 1. The results are shown in Table 1.

TABLE 1

|  | Uniformity of ion implantation $\sigma/\bar{X}^{1)}$ | Surface resistance after ion implantation (Ω) |
| --- | --- | --- |
| Example 1 | 24.7% | $1.0 \times 10^{10}$ |
| Example 2 | 20.9% | $1.0 \times 10^{10}$ |
| Example 3 | 15.9% | $1.0 \times 10^{10}$ |
| Comparative Example | >100% | $1.9 \times 10^{10}$ |

Note: $^{1)}\bar{X}$ shows the mean value of the amount of implanted ions with respect to the whole surface of wafer, and σ shows the variance. Namely, it is shown that the uniformity of ion implantation is better as the value of $\sigma/\bar{X}$ is smaller.

We claim:

1. An antistatic photo-resist admixture, comprising an antistatic agent and a photo-resist which both absorb light at the same wavelength, said antistatic agent absorbing a smaller quantity of light than said photo-resist, said antistatic agent not reducing the resolving power of the photo-resist, said antistatic photo-resist admixture being used for a mask in ion implantation of a semiconductor substrate, said antistatic photo-resist admixture comprising:

a) an antistatically effective amount of an antistatic agent having an ionization potential of not larger than about 7.5 eV which is at least one member selected from the group consisting of hydrazones, ethylcarbazole and p-bis(dimethylamino)benzene, and b) a positive-type photo-resist containing a photosensitive o- quinone diazide in an amount sufficient for forming a patterned photo-resist mask; said antistatic agent containing substantially no alkali metal ion, halogen ion or heavy metal.

2. The antistatic photo-resist admixture according to claim 1, wherein said antistatic agent is ethylcarbazole, p-dimethylaminobenzaldehyde diphenylhydrazone or p-bis(dimethylamino)benzene.

3. The antistatic photo-resist admixture according to claim 1, wherein said antistatic agent is p-dimethylaminobenzaldehyde diphenylhydrazone, p-diethylaminobenzaldehyde diphenylhydrazone, ethylcarbazole or p-bis(dimethylamino)benzene.

4. The antistatic photo-resist admixture according to claim 1, wherein said antistatic agent is p-diethylaminobenzaldehyde diphenylhydrazone.

5. The antistatic photo-resist admixture according to claim 1, wherein the amount of the antistatic agent is 0.1–15 wt. % based on the solid content of the photo-resist admixture.

* * * * *

UNITED STATES PATENT AND TRADEMARK OFFICE
CERTIFICATE OF CORRECTION

PATENT NO. : 5,168,030
DATED : December 1, 1992
INVENTOR(S) : Konoe Miura et al.

It is certified that error appears in the above-identified patent and that said Letters Patent is hereby corrected as shown below:

On the title page, Item [30],

The Foreign Application Priority Data has been omitted, should be,

--Oct. 13, 1986 [JP] Japan....................61-242793--.

Signed and Sealed this

Twenty-sixth Day of October, 1993

Attest:

BRUCE LEHMAN

*Attesting Officer*   *Commissioner of Patents and Trademarks*